United States Patent [19]

Takeuchi et al.

[11] Patent Number: 4,683,396

[45] Date of Patent: Jul. 28, 1987

[54] COMPOSITE ULTRASONIC TRANSDUCERS AND METHODS FOR MAKING SAME

[75] Inventors: Hiroshi Takeuchi, Matsudo; Chitose Nakaya, Nishitama; Kageyoshi Katakura, Meguro, all of Japan

[73] Assignees: Hitachi, Ltd.; Hitachi Medical Corporation, both of Tokyo, Japan

[21] Appl. No.: 661,928

[22] Filed: Oct. 17, 1984

[30] Foreign Application Priority Data

Oct. 17, 1983 [JP] Japan ........................ 58-192415
Nov. 2, 1983 [JP] Japan ........................ 58-204837

[51] Int. Cl.⁴ ........................ H01L 41/08
[52] U.S. Cl. ........................ 310/358; 310/357
[58] Field of Search ........................ 310/357-359, 310/311, 800

[56] References Cited

U.S. PATENT DOCUMENTS 4,412,148 10/1983 Klicker et al. .................. 310/800 X
4,518,889 5/1985 Hoen .................................. 310/357

OTHER PUBLICATIONS

Transverse Honeycomb Composite Transducers, by Safari et al, Materials Research Bulletin, vol. 17, No. 3, Mar. 1982, pp. 301-308.

*Primary Examiner*—Mark O. Budd
*Attorney, Agent, or Firm*—Antonelli, Terry & Wands

[57] ABSTRACT

A ultrasonic transducer using such a piezoelectric composite that a number of piezoelectric poles made of piezoelectric ceramics are arranged in a plate-like polymer matrix perpendicular to the plate surface. The volume ratio of the piezoelectric poles is set in a range of 0.15–0.75 and a spacing between every adjacent piezoelectric poles is set smaller than the thickness of the polymer plate, thereby resulting in a transducer which has higher sensitivity than the conventional one using a homogeneous piezoelectric ceramic plate.

19 Claims, 32 Drawing Figures

COMPOSITE ULTRASONIC TRANSDUCERS AND METHODS FOR MAKING SAME

FIELD OF THE INVENTION

The present invention relates to a ultrasonic transducer for use in ultrasonic diagnostic apparatus, etc.

BACKGROUND OF THE INVENTION

Heretofore, in many cases there have been used zircon lead titanate (PZT) ceramics as materials for a piezoelectric vibrator of ultrasonic transducers. Those piezoelectric ceramics are, however, disadvantageous in: (i) an acoustic matching layer requires an ingenious design when used for diagnostic purposes, because acoustic impedance is significantly larger than that of the human body, (ii) a dielectric constant is significantly large and hence a piezoelectric voltage constant g is so small that high voltage can not be produced upon receiving ultrasonic waves, and (iii) it is difficult for those ceramics to have a curvature fit for the shape of the human body. To solve such problems, there have been proposed so-called piezoelectric composites in which polymers are compounded with piezoelectric substances. As one example, Newnham, et. al. in the United States reported that such a composite structure is effective where a number of PZT poles 12 are buried in a polymer 11 as shown in FIG. 1 (see "Material Research Briden", Vol. 13, pp. 525–536 (1978)). In fact, the composite structure of PZT and polymers, such as silicon rubber or epoxy, results in a material having low acoustic impedance and a large piezoelectric voltage constant g.

In those piezoelectric composites, their piezoelectric characteristics are greatly varied depending on the volume ratio of the piezoelectric substance to the polymer. This is described in detail in the above reference. But it is expected that the piezoelectric characteristics also varied depending on the size and arrangement of piezoelectric poles even with the same volume ratio of the piezoelectric substance.

SUMMARY OF THE INVENTION

One object of the present invention is to provide a composite ultrasonic transducer which is superior in the transmitting and receiving overall sensitivity to a conventional transducer using a PZT ceramic plate.

Another object of the present invention is to provide methods for manufacturing high-reliable piezoelectric composites capable of mass production.

The present invention is featured in a ultrasonic transducer made of a piezoelectric composite of such structure that a number of ceramic piezoelectric poles are buried in a plate-like polymer matrix perpendicular to the plate surface, wherein the volume ratio of the piezoelectric poles is in a range of 0.15–0.75, and the height of each piezoelectric pole is larger than a spacing between every adjacent piezoelectric pole.

Other features of the present invention will be apparent from the following detailed description.

DESCRIPTION OF PREFERRED EMBODIMENTS

Figure 1:
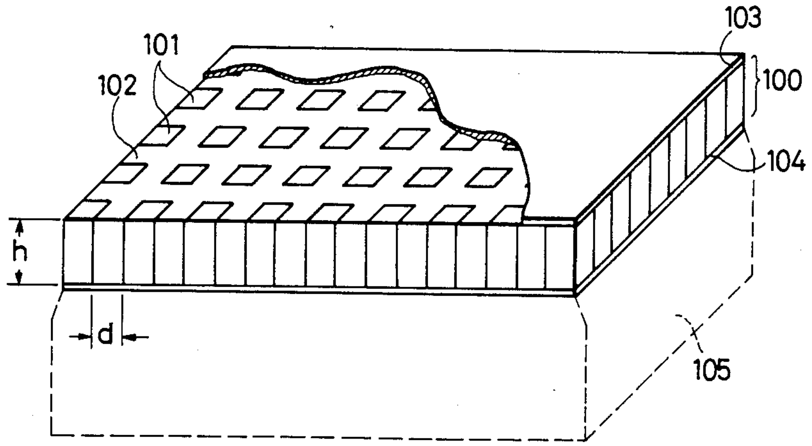
FIG. 1 is a perspective view showing one embodiment of the present invention.

FIG. 1 illustrates a structure of one embodiment of the present invention. A piezoelectric composite 100 fabricated by a later-described manufacturing process is so structured that a number of ceramic piezoelectric poles are arranged in a polymer matrix 102 with constant spacings d. Electrodes 103 and 104 are formed on both the upper and lower surfaces of the piezoelectric composite 100 to thereby constitute a composite transducer.

PZT ($Pb(TiZr)O_3$) ceramics or lead titanate ($PbTiO_3$) ceramics, which are polarized in the lengthwise direction, are preferable as the piezoelectric poles 101. Silicone rubber, polyurethane or epoxy resin is preferable as the polymer 102. The electrodes are preferably formed of chrome - gold films, but they may be of course formed of other suitable electroconductive films.

Figure 2:
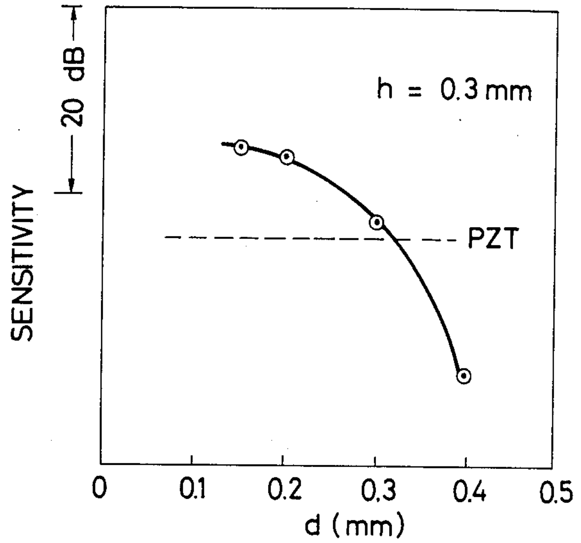
FIGS. 2 and 3 are characteristic graphs showing sensitivity characteristics of a transducer.

FIG. 2 shows the measured result of changes in sensitivity relative to varying spacings d between the piezoelectric poles 101 for the composite transducer of FIG. 1 which was manufactured using PZT ceramics and silicon rubber. This measurement was conducted with four types of transducers made of piezoelectric composites which are 10 mm square, 0.3 mm in thickness h, and 0.15, 0.2, 0.3 and 0.4 mm in spacing d between the piezoelectric poles, respectively. The volume ratio of the piezoelectric poles 101 to the entire piezoelectric composite was set to 25% for any of the transducers. Each transducer had about 4.5 MHz resonance frequency in depthwise longitudinal vibrations.

For the purpose of comparison, FIG. 2 also shows the data (in broken line) relating to a conventional ultrasonic transducer which was manufactured using homogeneous PZT ceramics with the same aperture and the same resonance frequency. As will be apparent from FIG. 2, the transmitting and receiving sensitivity of the present transducer is higher than that of the conventional transducer when the interpole spacing d is smaller than the thickness h of the ceramics, but is is rapidly reduced when d exceeds h. This is attributable to the fact that, in case of $d<h$, the filled polymer transmits the received pressure to the piezoelectric poles effectively so that the polymer and the piezoelectric poles are both vibrated together in the depthwise direction, whereas, in case of $d>h$, the pressure is not transmitted effectively so that the polymer and the piezoelectric poles will not vibrate together.

Figure 3:
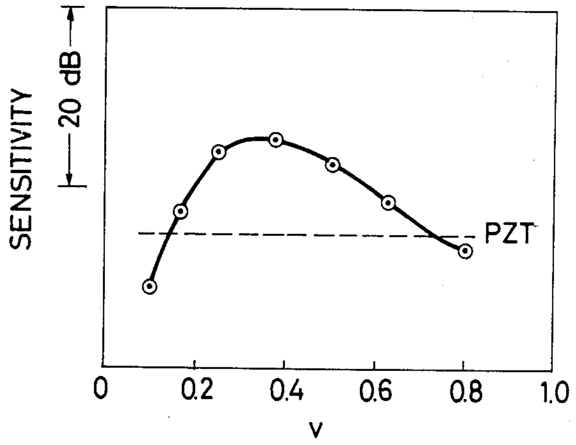

FIG. 3 shows the relationship between the volume ratio of PZT ceramics and the transmitting and receiving sensitivity. For the purpose of comparison, FIG. 3 also shows the data (in broken line) relating to a conventional ultrasonic transducer which was manufactured using a homogeneous PZT ceramic plate with the same aperture. As will be apparent from FIG. 3, the transmitting and receiving overall sensitivity of the present transducer is higher than that of the conventional ultrasonic transducer using a homogeneous PZT ceramic plate in a range of the volume ratio between 0.15 and 0.75. Thus, even when the condition of $d<h$ is satisfied, there can not be obtained high sensitivity necessarily, if the volume ratio of PZT ceramics is smaller than 0.15 or larger than 0.75.

As described above, as to the composite ultrasonic transducer shown in FIG. 1, a high-sensitive transducer is obtained on conditions that the volume ratio of piezoelectric poles to the entire piezoelectric composite is in a range of 0.15–0.75 and the arrangement spacing d between the piezoelectric poles is smaller than the height h thereof.

Furthermore, as shown in FIG. 1 with broken lines, it is also possible that a backing member 105 made of, e.g., epoxy resin, is attached to either one surface of the piezoelectric composite having the electrodes formed on both surfaces, and the other surface is used for transmitting and receiving ultrasonic waves.

The manufacturing process of the piezoelectric composite 100 in the above-mentioned embodiment will now be described with reference to FIGS. 4A–4C.

Figure 4A:
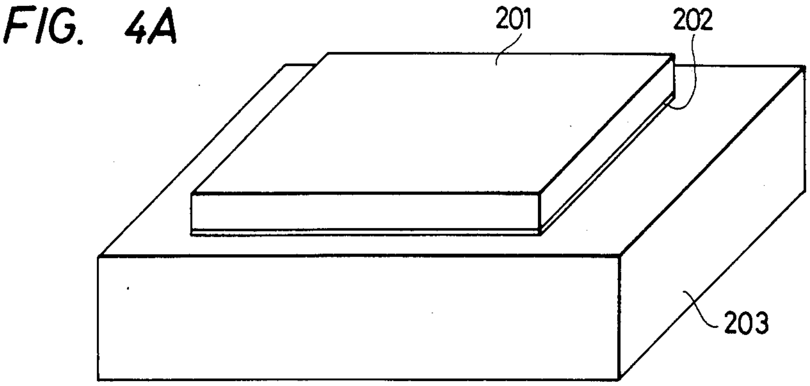
FIGS. 4A–4C, FIGS. 5A–5H, FIGS. 6A and 6B and FIGS. 7A–7G are views showing the manufacturing process of the above embodiment.
Figure 4B:
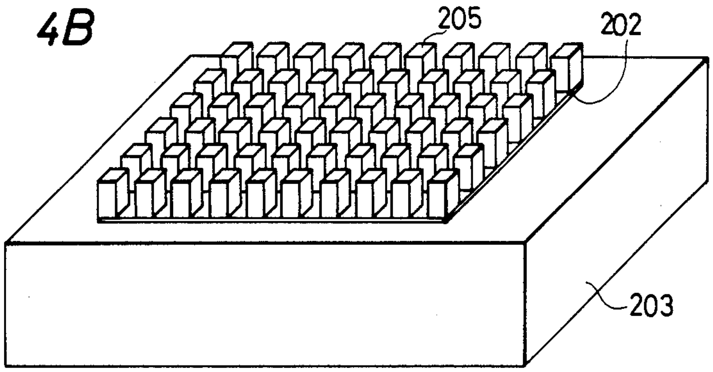
Figure 4C:
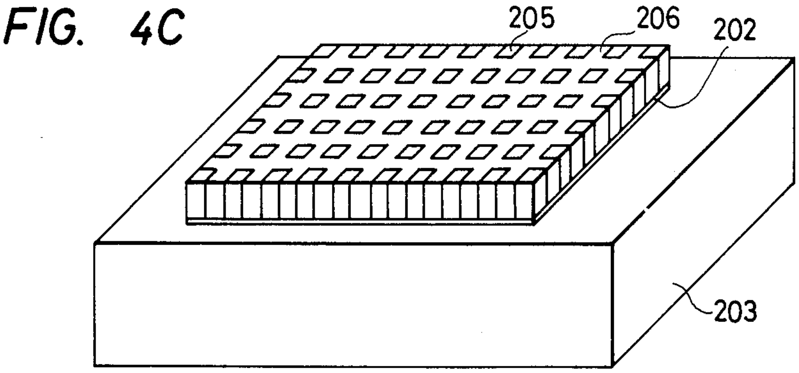

In the step of FIG. 4A, a piezoelectric ceramic plate 201 in the flat form is tentatively bonded to a cutting base 203 by making use of an adhesive 202 such as wax, for example, which is softened under heating. As shown in FIG. 4B, a number of grooves are formed to cut the piezoelectric ceramic plate longitudinally and transversely, thereby fabricating a number of elements 205. Next, polymer 206 is filled and solidified in each cut groove and, thereafter, it is torn off the cutting base so as to obtain the piezoelectric composite 100 of FIG. 1.

The above manufacturing process is advantageous in the reduced number of steps, but has the following disadvantages:

(1) The elements 205 tend to be chipped off, because the piezoelectric ceramic plate is deeply cut; and (2) The grooves may also often be cut in the base 203 in the step of cutting, so that the polymer 206 is secured to the base 203. In this case, it becomes difficult to tear off the piezoelectric composite from the base 203 and some of the elements 205 tend to be broken during tearing-off. It becomes also difficult to remove the adhesive 202 after the step of tearing-off.

Figure 5A:
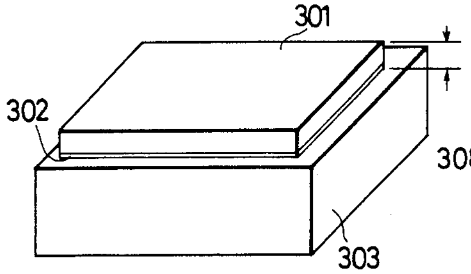
Figure 5E:
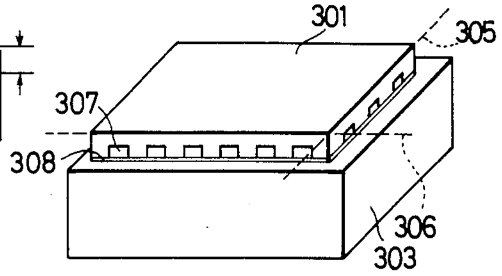
Figure 5B:
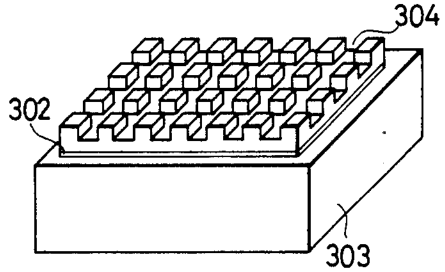
Figure 5F:
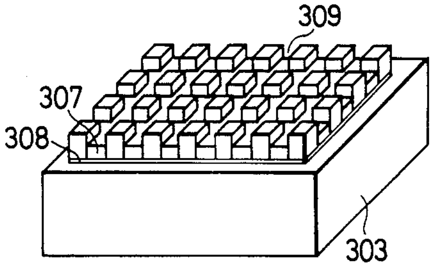
Figure 5C:
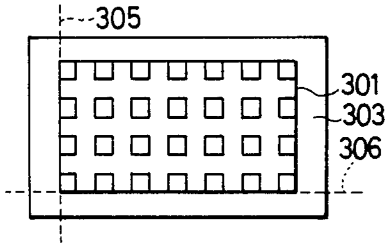
Figure 5G:
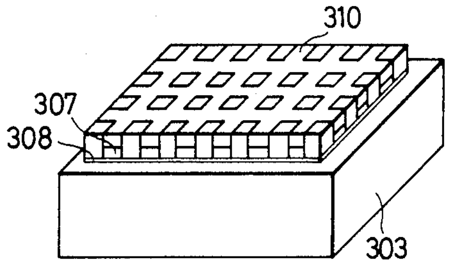
Figure 5D:
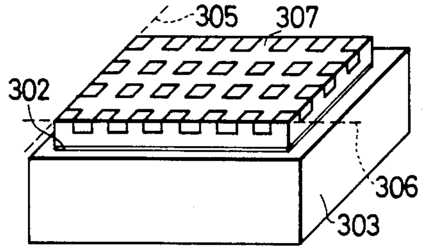
Figure 5H:
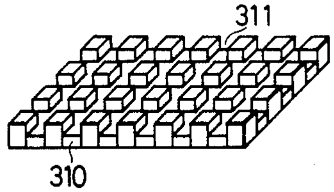

The alternative manufacturing process improved to eliminate such disadvantages is illustrated in FIGS. 5A–5H. First, as shown in FIG. 5A, a piezoelectric ceramic plate is tentatively bonded to a cutting base 303 using wax 302. Next, as shown in FIG. 5B, grooves 304 of depth nearly equal to a half of the thickness h of the plate 301 are formed therein to cut the plate 301 longitudinally and transversely without penetrating therethrough. In the step of this cutting, reference lines 305 and 306 are prepared on the plate 301. FIG. 5C is a top plan view of FIG. 5B as looked from above. Then, as shown in FIG. 5D, a polymer 307 such as polyurethane or epoxy is filled and solidified in the grooves 304. Next, the wax 302 is melted causing a vibrator to be turned over and again bonded to the cutting base 303 using wax or the like 308, as shown in FIG. 5E. Subsequently, as shown in FIG. 5F, grooves 309 are cut to reach the polymer 307 with the lines 305 and 306 as references. In the step of FIG. 5G, a polymer is filled and solidified in the grooves 309 to form the polymer portion 310 on the reverse side of the transducer. After melting the wax 308, it is torn off from the base 303 to thereby obtain the piezoelectric composite 100 of FIG. 1. On this occasion, the polymer 307 is required to have such quality as not degrading machinability at the time when the grooves 309 are cut. If the filler introduced in the grooves 304 is of a soft material such as silicone rubber, there occurs a problem in machinability. In such a case, wax or the like is filled in the grooves 304 in the step of FIG. 5B, and the resultant piezoelectric plate is turned over and again bonded to the base 303 (the state of FIG. 5E). After cutting the grooves 309 as shown in FIG. 5F, silicon rubber is filled and solidified therein. In the state of FIG. 5G in this case, 307 designates wax and 310 designates silicone rubber. Next, the vibrator is removed from the base 303 (the individual elements are bonded to one another with silicon rubber at this time) and the wax in the grooves 304 is washed out, thus resulting in the state of FIG. 5H. Finally, silicone rubber or the like is filled and solidified in cut grooves 311 now deprived of wax to thereby provide the piezoelectric composite 100 of FIG. 1.

It is to be noted that the polymers 307 and 310 are not always required to be made of the same material. For example, it is possible that 307 is formed of polyurethane and 310 is formed of silicone rubber.

Figure 6A:
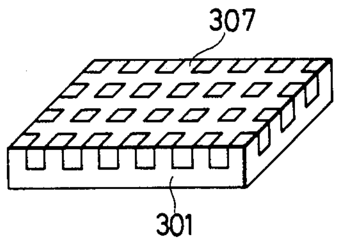
Figure 6B:
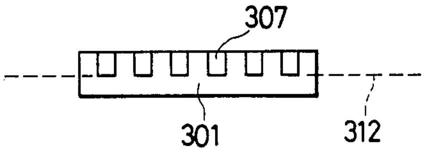

As an alternative, the piezoelectric composite 100 can be also manufactured in such a manner that the piezoelectric ceramic plate in the state of FIG. 5D is removed from the cutting base as shown in FIG. 6A, and then the resultant piezoelectric ceramic plate is ground from the bottom up to a plane 312 as shown in FIG. 6B. In place of grinding, it may be cut at the plane 312.

According to the manufacturing process shown above in FIGS. 5A-5H or FIGS. 6A and 6B, the grooves in which the polymer is to be filled will not reach the cutting base, thus resulting in the advantage that it is easy to tear off the piezoelectric ceramic plate filled with the polymer from the cutting base.

In any of the manufacturing processes shown in FIGS. 4A–4C, FIGS. 5A–5H and FIGS. 6A–6B, another polymer which can be easily removed by washing, is preferably coated in advance on the upper and lower surfaces of the piezoelectric ceramic plate 201 or 301, for the purpose of preventing the polymer from securing to the upper and lower surfaces of the piezoelectric poles.

Figure 7A:
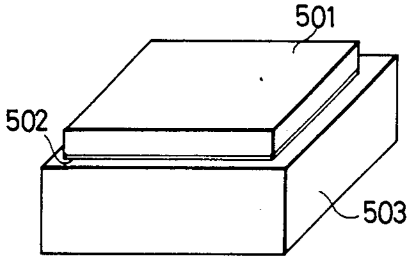
Figure 7B:
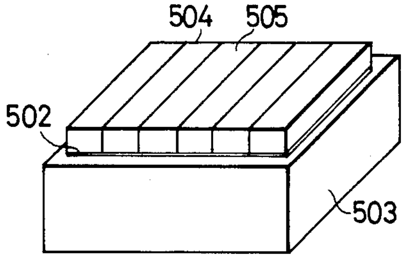
Figure 7C:
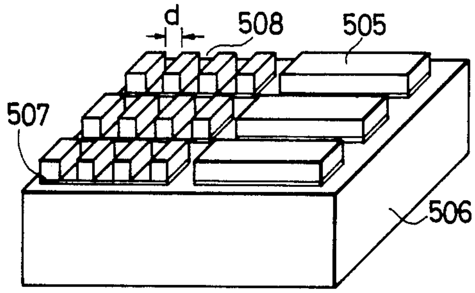
Figure 7D:
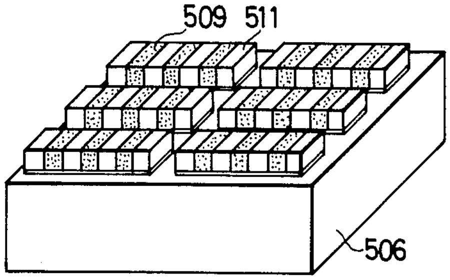
Figure 7E:
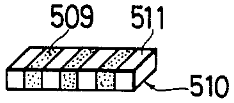
Figure 7F:
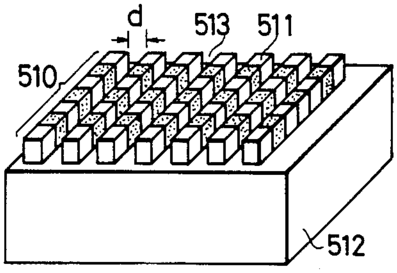
Figure 7G:
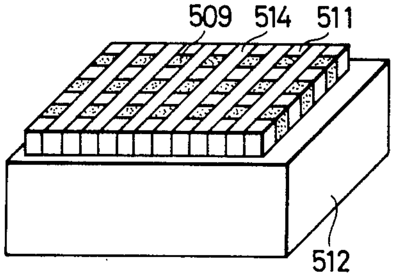

FIGS. 7A–7G illustrate the alternative manufacturing process for obtaining the piezoelectric composite 100 of FIGS. 1. A piezoelectric ceramic plate 501 is tentatively bonded to a cutting base 503 using wax or the like 502 (FIG. 7A), and the plate, i.e., a vibrator, is cut at 504 thoroughly to form a plurality of vibrator pieces 505 each having an appropriate width (FIG. 2B). Next, the vibrator pieces 505 are removed and then again tentatively bonded to a cutting base 506 with intervals using wax or the like 507, as shown in FIG. 7C. Grooves 508 each having a width d are cut in each vibrator piece 505. Next, a polymer 509 is filled in the respective grooves as shown in FIG. 7D. Subsequently, each vibrator piece 505 is removed from the base, thus resulting in a piece 510 as shown in FIG. 7E. At this time, individual elements 511 are bonded to each other with the polymer 509. Next, the pieces 510 are arranged on a base 512 with a spacing d therebetween, as shown in FIG. 7F. A polymer 514 is filled in each space 513 as shown in FIG. 7G and the base 512 is then removed therefrom, thereby providing the piezoelectric composite. On this occasion, the polymers 509 and 510 may be formed of different materials.

In the above manufacturing process, shallow grooves for arrangement are preferably formed in the upper surface of the base 512 in advance, in order to effectively arrange the plurality of the pieces 510 in the step of FIG. 7F.

The manufacturing process shown in FIGS. 7A–7G is advantageous in that, since there is no need of cutting grooves in which a polymer is to be filled, the possibility is reduced that the piezoelectric ceramics may be broken in the step of cutting grooves.

Figure 8A:
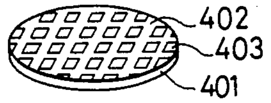
FIGS. 8A–8F, FIG. 9 and FIGS. 10A–10B are views showing the manufacturing process of another embodiment of the present invention.
Figure 8B:
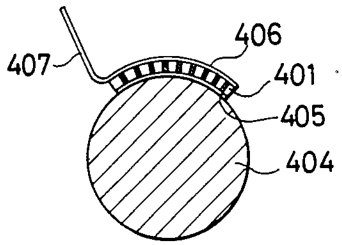

In the piezoelectric composite thus obtained, if a flexible polymer is used as the polymer, the composite itself becomes flexible. Therefore, it becomes possible to easily form a transducer with an arbitrary shape such as a concave surface. FIGS. 8A–8B illustrate the process for manufacturing a transducer with a circular concave surface by way of example.

First, as shown in FIG. 8A, a circular piezoelectric composite 401 is prepared. This circular composite is obtained by cutting the piezoelectric composite resulted from the process shown in FIGS. 4A–4C, FIGS. 5A–5H or FIGS. 6A and 6B into the circular form. Alternatively, if a circular piezoelectric ceramic plate is employed as 301 in FIG. 4A, the circular piezoelectric composite can be naturally obtained. It is to be noted that 402 designates a polymer matrix and 403 designates a piezoelectric pole. Next, as shown in a sectional view of FIG. 8B, the piezoelectric composite 401 is bonded to the surface of a sphere 404 using resin (wax or the like) which is softened under heating, the sphere 404 having the same curvature as the desired concave surface.

Figure 8C:
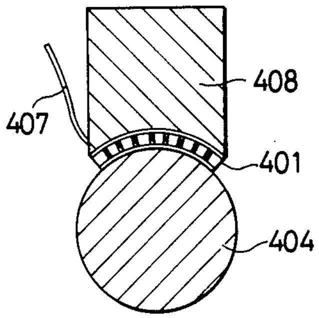
Figure 8D:
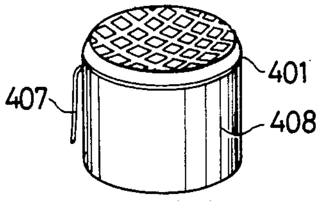
Figure 8E:
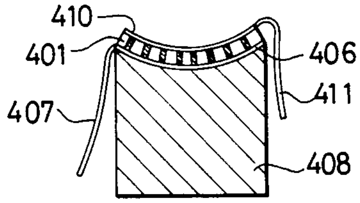
Figure 8F:
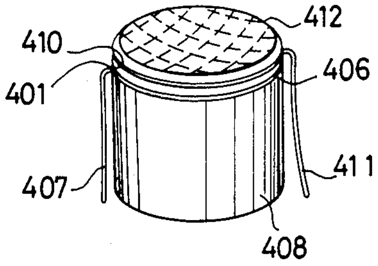

Next, an electrode 406 is formed on the upper surface of the piezoelectric composite 401 by screen printing, evaporation or so. At this time, to prevent the electrode from being formed also on the side faces of 401, it is more preferable to coat the side faces thereof with wax. Subsequently, a signal line 407 is connected to the sphere 404 with an electroconductive paste and, as shown in a sectional view of FIG. 8C, a backing member 408 is formed on the electrode 406. As an alternative, the backing member 408 shaped into the desired form may be fixed to the electrode 406 using an adhesive. Furthermore, if an electroconductive paste with adhesiveness is used as the electrode 406, the electrode itself can be employed also as an adhesive. Next, the sphere 404 is removed away under heating and a front surface of the piezoelectric composite 401, thus resulting in the state of FIG. 8D. Thereafter, as shown in a sectional view of FIG. 8E, another electrode 410 is formed on the front surface by screen printing, evaporation or so. In this example, 410 serves as an earth side electrode. Next, an earth wire 411 is connected to the electrode 410. However, if it remains as it is, there is a large possibility that the electrode 410 tends to tear off. For this reason, a film 412 is formed on the front surface which film has the effect of protecting the electrode 410. As a result, a concave transducer as shown in FIG. 8F is fabricated.

Figure 9:
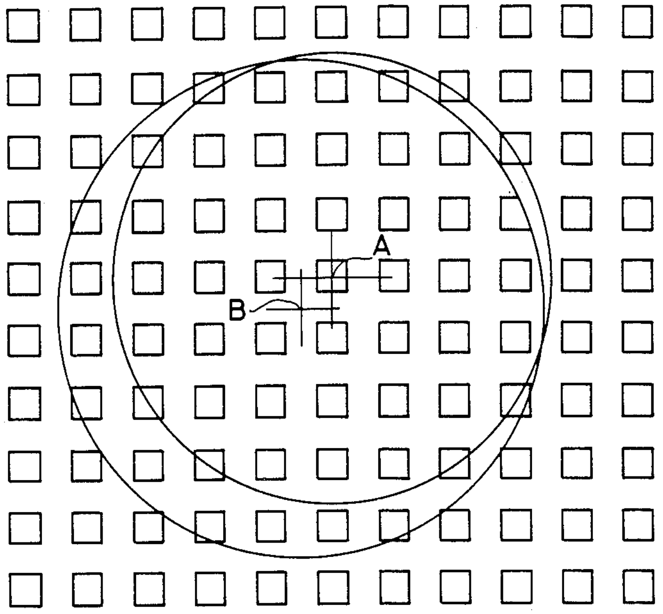

In the process of manufacturing the circular transducer as mentioned above, it is preferable to pay due consideration so that the transducer becomes bisymmetrical. More specifically, the piezoelectric composite is preferably cut into the form of a circle with its center located at such a point as the center of the piezoelectric pole represented by A in FIG. 9 or the point equally spaced from the four surrounding piezoelectric poles represented by B therein.

Figure 10A:
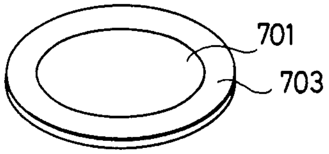
Figure 10B:
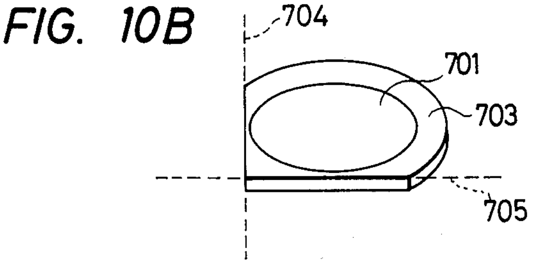

Meanwhile, in case the process shown in FIGS. 5A–5H is employed to obtain the piezoelectric composite using a piezoelectric ceramic plate in the form of a disc from the beginning, it is preferable to adopt the manufacturing process as shown in FIGS. 10A and 10B. More specifically, as shown in FIG. 10A, an auxiliary member 703 such as epoxy resin is formed in the circumference of a disc-like piezoelectric ceramic plate 701. Subsequently, the auxiliary member 703 is cut at lines 704 and 705 as shown in FIG. 10B, the lines 704, 705 corresponding to the reference lines 305, 306 shown in FIG. 5C. Thus, the desired piezoelectric composite can be obtained through the steps of cutting and filling in a similar manner to those shown in FIGS. 5A–5H.

We claim:

1. A composite ultrasonic transducer comprising a plurality of ceramic piezoelectric poles having a height, arranged in a plate-like polymer matrix having opposing surfaces, wherein said piezoelectric poles are arranged such that their height direction is perpendicular to said opposing surfaces, the volume ratio of said piezoelectric poles to that of the entire composite is in the range of 0.15 to 0.75, and the height of each of said piezoelectric poles is larger than a spacing between every adjacent piezoelectric pole.

2. A composite ultrasonic transducer according to claim 1, made by a process comprising the steps of:

cutting grooves into a piezoelectric ceramic plate leaving a part of the plate in the depthwise direction;

filling a polymer into the thus-cut grooves;

turning over said piezoelectric ceramic plate;

forming another set of grooves in the piezoelectric plate so as to reach corresponding cut grooves; and filling a polymer into said another set of grooves.

3. A composite ultrasonic transducer according to claim 1, made by a process comprising the steps of:

cutting grooves into a piezoelectric ceramic plate from a surface thereof leaving a part of the plate in the depthwise direction;

filling a polymer into the thus-cut grooves; and grinding the opposed surface of the piezoelectric ceramic plate so as to expose said filled polymer.

4. A composite ultrasonic transducer made of a piezoelectric composite of such structure that a number of ceramic piezoelectric poles are buried in a plate-like polymer matrix perpendicular to the plate surface, said piezoelectric composite improved in that the volume ratio of said piezoelectric poles is in a range of 0.15–0.75, and the height of each said piezoelectric pole is larger than a spacing between every said adjacent piezoelectric poles.

5. A composite ultrasonic transducer according to claim 1, wherein said ceramic piezoelectric poles are made of a material selected from the group consisting of PZT and lead titanate.

6. A composite ultrasonic transducer according to claim 1, wherein said polymer matrix is made of a material selected from the group consisting of silicone resin, polyurethane and epoxy resin.

7. An ultrasonic transducer according to claim 1, wherein said ceramic piezoelectric poles are made of PZT and said polymer matrix is made of silicone resin.

8. An ultrasonic transducer according to claim 1, wherein said ceramic piezoelectric poles are arranged such that the spacing between every pair of adjacent ceramic piezoelectric poles is equal.

9. A composite ultrasonic transducer according to claim 1, wherein the volume ratio of said piezoelectric poles to the entire composite is about 0.25.

10. A composite ultrasonic transducer according to claim 1, wherein said opposing surfaces are front and rear surfaces of the transducer and said front surface has a concave shape.

11. A composite ultrasonic transducer according to claim 10, wherein a protective film is formed over said front surface.

12. A composite ultrasonic transducer according to claim 11, wherein the rear surface of the transducer is on a backing member.

13. A composite ultrasonic transducer according to claim 12, wherein an electrode is formed on each of said front and rear surfaces and said protective film is formed on the electrode formed on said front surface.

14. A composite ultrasonic transducer according to claim 10, wherein the rear surface of the transducer is on a backing member.

15. A composite ultrasonic transducer according to claim 1, wherein said plate-like polymer matrix is in the shape of a disk.

16. A composite ultrasonic transducer according to claim 1, wherein said opposing surfaces are flat.

17. A composite ultrasonic transducer according to claim 1, wherein the transducer is circular.

18. A composite ultrasonic transducer according to claim 17, wherein the circular transducer is bisymmetrical with respect to the piezoelectric poles.

19. A composite ultrasonic transducer according to claim 1, wherein the circular transducer is bisymmetrical with respect to the piezoelectric poles.

* * * * *